(12) United States Patent
Salahuddin et al.

(10) Patent No.: US 11,251,036 B2
(45) Date of Patent: Feb. 15, 2022

(54) SEMICONDUCTOR DEVICES AND METHODS OF MANUFACTURING SEMICONDUCTOR DEVICES

(71) Applicant: IMEC vzw, Leuven (BE)

(72) Inventors: Shairfe Muhammad Salahuddin, Leuven (BE); Alessio Spessot, Heverlee (BE)

(73) Assignee: IMEC vzw, Leuven (BE)

(*) Notice: Subject to any disclaimer, the term of this patent is extended or adjusted under 35 U.S.C. 154(b) by 0 days.

(21) Appl. No.: 16/719,725

(22) Filed: Dec. 18, 2019

(65) Prior Publication Data

US 2020/0211839 A1 Jul. 2, 2020

(30) Foreign Application Priority Data

Dec. 28, 2018 (EP) .................................... 18248304

(51) Int. Cl.
*H01L 29/51* (2006.01)
*H01L 21/02* (2006.01)
(Continued)

(52) U.S. Cl.
CPC .. *H01L 21/02181* (2013.01); *H01L 21/02233* (2013.01); *H01L 21/28185* (2013.01);
(Continued)

(58) Field of Classification Search
CPC ......... H01L 21/02181; H01L 21/02233; H01L 21/28185; H01L 21/28194; H01L 29/1033;
(Continued)

(56) References Cited

U.S. PATENT DOCUMENTS 4,072,797 A 2/1978 Gass et al.
4,104,096 A 8/1978 Gass et al.
(Continued)

FOREIGN PATENT DOCUMENTS

CN 104282749 A 1/2015
CN 107482064 A 12/2017

OTHER PUBLICATIONS

Lo, Chun-Li et al., "Atomically Thin Diffusion Barriers for Ultra-Scaled Cu Interconnects Implemented by 2D Materials," Jun. 1, 2017, pp. MR-4.1-MR-4.4, IEEE International Reliability Physics Symposium, Monterey, CA.
(Continued)

*Primary Examiner* — Thomas L Dickey
(74) *Attorney, Agent, or Firm* — Knobbe, Martens, Olson & Bear, LLP

(57) ABSTRACT

The disclosed technology generally relates to semiconductor devices and methods of manufacturing semiconductor devices such as both logic and memory semiconductor devices. In one aspect, a semiconductor device includes a semiconductor substrate having a channel region between a source and a drain region, a gate structure arranged to control the channel region and a dielectric structure arranged between the channel region and the gate structure. The dielectric structure includes a high-k dielectric layer or a high-k ferroelectric layer and at least one two dimensional (2D) hexagonal boron-nitride (h-BN) layer in direct contact with the high-k dielectric layer or the high-k ferroelectric layer.

23 Claims, 3 Drawing Sheets

(51) Int. Cl.
    *H01L 21/28*      (2006.01)
    *H01L 29/10*      (2006.01)
    *H01L 29/49*      (2006.01)
    *H01L 29/66*      (2006.01)

(52) U.S. Cl.
    CPC .... *H01L 21/28194* (2013.01); *H01L 29/1033* (2013.01); *H01L 29/4966* (2013.01); *H01L 29/516* (2013.01); *H01L 29/518* (2013.01); *H01L 29/66575* (2013.01)

(58) Field of Classification Search
    CPC . H01L 29/4966; H01L 29/516; H01L 29/518; H01L 29/66575
    See application file for complete search history.

(56) References Cited

U.S. PATENT DOCUMENTS

| | | |
|---|---|---|
| 6,225,169 B1 | 5/2001 | Chew et al. |
| 6,974,779 B2 | 12/2005 | O'Meara et al. |
| 8,575,709 B2 | 11/2013 | Bu et al. |
| 9,831,243 B2 | 11/2017 | Yu et al. |
| 2016/0005609 A1 | 1/2016 | Di et al. |
| 2016/0343805 A1 | 11/2016 | Lee et al. |
| 2017/0033003 A1 | 2/2017 | Song et al. |
| 2019/0148499 A1* | 5/2019 | Lin ................ H01L 29/267 257/288 |

OTHER PUBLICATIONS

Yum et al., Epitaxial ALD BeO: Efficient Oxygen Diffusion Barrier for EOT Scaling and Reliability Improvement, IEEE Transactions on Electron Devices, vol. 58, No. 12, Dec. 2011, pp. 4384-4392.

\* cited by examiner

SEMICONDUCTOR DEVICES AND METHODS OF MANUFACTURING SEMICONDUCTOR DEVICES

CROSS-REFERENCE TO RELATED APPLICATIONS

This application claims foreign priority to European Application No. EP 18248304.0, filed on Dec. 28, 2018, the content of which is incorporated by reference herein in its entirety.

BACKGROUND

Field

The disclosed technology relates to semiconductor devices and methods of manufacturing semiconductor devices such as both logic and memory semiconductor devices.

Description of the Related Technology

Processing of semiconductor devices such as logic or memory devices often includes thermal annealing steps, e.g., after processing steps such as source and drain implantation to activate dopants. Thermal annealing. However, such annealing steps may haven undesirable consequences, e.g., inducing diffusion of metal atoms into a high-k gate dielectric and/or diffusion of oxygen atoms from the high-k gate dielectric into the underlying silicon channel region. These diffusion processes can degrade reliability of devices and degrade endurance of the gate oxide in semiconductor devices.

SUMMARY OF CERTAIN INVENTIVE ASPECTS

The present disclosure to provide a semiconductor device with improved endurance, reliability and lifetime. The present disclosure also provides an alternative dielectric structure which does not significantly increase an equivalent oxide thickness (EOT) of the gate dielectric stack.

In a first aspect, the disclosed technology provides a semiconductor device including a semiconductor substrate including a channel region in between a source and a drain region, a gate structure arranged on the semiconductor substrate to interact with the channel region, and a dielectric structure arranged between the channel region and the gate structure, the dielectric structure including a high-k dielectric layer or a high-k ferroelectric layer and at least one two dimensional (2D) hexagonal boron-nitride (h-BN) layer in direct contact with the high-k dielectric layer or the high-k ferroelectric layer.

Advantageously, the endurance and reliability of the semiconductor device is improved. This applies for both logic devices as well as memory devices such as ferroelectric device (FeFETs). Further, an equivalent oxide thickness (EOT) is not impacted by the introduction of a barrier layer in the gate dielectric stack. Also, carrier mobility is not affected. Also, the amount of layers in the gate stack can be reduced without compromising the device characteristics.

In some embodiments, the at least one 2D h-BN layer can be located between the channel region and the high-k dielectric layer or the high-k ferroelectric layer. Beneficially, substantially no oxygen diffusion occurs between the substrate and the high-k dielectric layer or the high-k ferroelectric layer.

In some embodiments, the at least one 2D h-BN layer can be located between the high-k dielectric layer or the high-k ferroelectric layer and the gate structure. Beneficially, substantially metal diffusion between the gate structure and the high-k dielectric layer or the high-k ferroelectric layer may be substantially reduced.

In some embodiments, another 2D h-BN layer may be present in direct contact with high-k dielectric layer or the high-k ferroelectric layer. This another 2D h-BN layer may be present at the opposite side of the high-k dielectric layer or the high-k ferroelectric layer at which the at least one 2D h-BN layer is located. Advantageously, both oxygen diffusion between substrate and high-k dielectric layer and metal diffusion between high-k dielectric layer and gate structure can be prevented.

In some embodiments, the at least one 2D h-BN layer or the another 2D h-BN layer has a thickness less than five atomic layers. In some embodiments, the at least one 2D h-BN layer or the another 2D h-BN layer has a thickness of 1 to 2 atomic layers of h-BN. A thin h-BN layer can lower the EOT of the dielectric structure.

In some embodiments, the high-k dielectric layer or high-k ferroelectric layer is a Hf-based dielectric or a Hf-based ferroelectric layer respectively.

In some embodiments, the gate structure includes a metal gate electrode.

In a second aspect, the disclosure provides a method for manufacturing a semiconductor device. The method includes the steps of providing a channel region in between a source and a drain region in a semiconductor substrate, providing at least on the channel region a dielectric structure. The step of providing a dielectric structure further includes providing a high-k dielectric layer or a high-k ferroelectric layer and providing at least one two dimensional (2D) h-BN layer in direct contact with the high-k dielectric layer or the high-k ferroelectric layer and providing a gate structure on the dielectric structure.

In some embodiments, providing the at least one 2D h-BN layer includes providing the layer in between the channel region and the high-k dielectric layer or the high-k ferroelectric layer or providing the layer in between the high-k dielectric layer or the high-k ferroelectric layer and the gate structure.

In some embodiments, another 2D h-BN layer is provided in direct contact with the high-k dielectric layer or the high-k ferroelectric layer at the opposite side of the high-k dielectric layer or the high-k ferroelectric layer at which the at least one 2D h-BN layer is located.

In some embodiments, the at least one or the another 2D h-BN layer is provided by epitaxial growth, or by mechanical or chemical exfoliation.

In some embodiments, providing the one or the another 2D h-BN layer includes providing less than five atomic layers of 2D h-BN.

In some embodiments, the high-k dielectric layer or the high-k ferroelectric layer includes a Hf-based dielectric layer or a Hf-based ferroelectric layer.

In some embodiments, providing the gate structure includes providing a metal gate structure.

BRIEF DESCRIPTION OF THE DRAWINGS

The disclosure will be further elucidated by means of the following description and the drawings.

Figure 2:
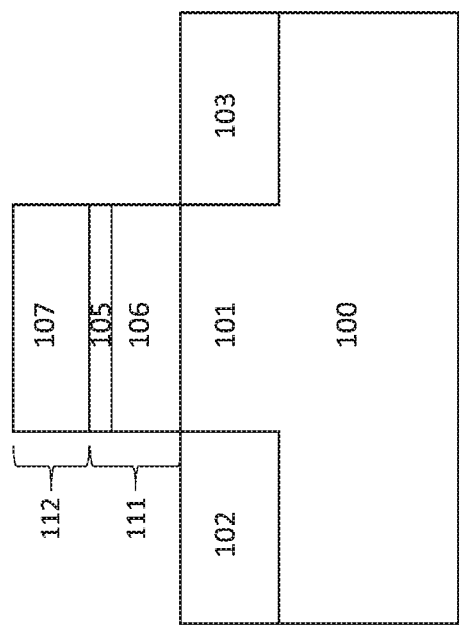
FIGS. 1 to 3 schematically illustrate a semiconductor device according to embodiments of a first aspect.

The drawings are only schematic and are non-limiting. In the drawings, the size of some of the elements may be exaggerated and not drawn on scale for illustrative purposes. The dimensions and the relative dimensions do not necessarily correspond to actual dimensions.

In the different drawings, the same reference signs refer to the same or analogous elements.

DETAILED DESCRIPTION OF CERTAIN ILLUSTRATIVE EMBODIMENTS

The introduction of diffusion barriers (or also often referred to as interface passivation layers) in the gate dielectric stack can potentially prevent diffusion of metal atoms into the high-k gate dielectric and/or diffusion of oxygen atoms from the high-k dielectric into the underlying silicon channel region. Barrier layers may be inserted in the gate stack (which includes a gate dielectric stack and a gate electrode stack on the gate dielectric stack) to prevent undesirable interface reactions. Introduction of these barrier layers may be beneficial to the gate stack electrical performance. Barrier layers may for example be inserted between the high-k dielectric layer and the substrate to prevent oxygen diffusion from the high-k dielectric into the underlying substrate or between the high-k dielectric layer and the metal gate electrode to prevent metal diffusion from the metal gate electrode into the high-k dielectric layer.

In the article Yum et al. "Epitaxial ALD BeO: efficient oxygen diffusion barrier for EOT scaling and reliability improvements," thin BeO layers are deposited by atomic layer deposition (ALD) on a Si substrate as an alternative for $SiO_2$ as an interfacial passivation layer. The ALD BeO layers provided control of the physical thickness of the device and minimized oxidation of the Si substrate surface. The layers also suppressed leakage current after post-deposition anneal.

In U.S. Pat. No. 9,831,243, a multi-composition-layer barrier layer is inserted between a high-k dielectric layer of $HfO_2$ layer and a TiN layer. This barrier layer proved to be conductive while preventing inter-layer diffusion and reaction between metals, silicon, or dielectric material. For example, the patent disclosed that a TiN barrier layer may be inserted between the high-k dielectric layer and Al metal from the metal gate electrode. However the introduction of these the barrier layer increased the equivalent oxide thickness (EOT) of the gate dielectric stack.

The disclosed technology will be further elucidated by the following detailed description and the drawings.

In the following, numerous specific details are set forth in order to provide a thorough understanding of the disclosure and how it may be practiced. However, it will be understood that the disclosed technology may be practiced without these specific details. In other instances, well-known methods, procedures, and techniques have not been described in detail, so as not to obscure the disclosed technology. While the disclosed technology will be described with respect to particular embodiments and with reference to certain drawings, the disclosure is not limited hereto. The drawings included and described herein are schematic and are not limiting the scope of the disclosure. It is also noted that in the drawings, the size of some elements may be exaggerated and, therefore, not drawn to scale for illustrative purposes.

The term "comprising," used in the claims, should not be interpreted as being restricted to the means listed thereafter; it does not exclude other elements or steps. Specifying the presence of the stated features, integers, steps or components as referred to does not preclude the presence or addition of one or more other features, integers, steps or components, or groups thereof. Thus, the scope of the expression "a device comprising means A and B" should not be limited to devices consisting only of components A and B.

Where in embodiments reference is made to the term "stack", reference is made to a stack of layers. This may involve only one layer but also more than one layer formed on top of one another. For example a gate dielectric stack may include only one gate dielectric layer or may include a sequence/pile of different gate dielectric layers formed on top of one another together forming the gate dielectric stack.

Where in embodiments reference is made to the term "high-k" as in "high-k dielectric," reference is made to a dielectric material with a dielectric constant larger than the dielectric constant of $SiO_2$, i.e. larger than 3.9 or 4 when a rounded number is used. High-k dielectrics may allow for a larger physical thickness (compared to $SiO_2$) for obtaining a same effective capacitance than can be obtained with a much thinner $SiO_2$ layer. An example of a high-k dielectric is for example an Hafnium (Hf)-based dielectric, such as $HfO_2$.

In the following embodiments will be described with reference to a silicon (Si) substrate but it should be understood that they can apply equally well to other semiconductor substrates. In some embodiments, the "substrate" may include a semiconductor substrate such as a silicon, a gallium arsenide (GaAs), a gallium arsenide phosphide (GaAsP), an indium phosphide (InP), a germanium (Ge), or a silicon germanium (SiGe) substrate. The "substrate" may include for example, an insulating layer such as a $SiO_2$ or a $Si_3N_4$ layer in addition to a semiconductor substrate portion. Thus, the term substrate also includes silicon-on-glass, silicon-on-sapphire substrates. The term "substrate" is thus used to define generally the elements for layers that underlie a layer or portions of interest. Also, the "substrate" may be any other base on which a layer is formed, for example a glass or metal layer. Accordingly a substrate may be a wafer such as a blanket wafer or may be a layer applied to another base material, e.g. an epitaxial layer grown onto a lower layer.

The semiconductor device according to embodiments of the disclosed technology are applicable to transistor-type devices such as logic devices such as metal-oxide-semiconductor field effect transistors (MOSFETs) or memory devices such as ferro-electric memory devices (FeFETs) or NAND flash memory devices. Transistor-type device may mean a device having at least three terminals which typically includes a channel region in between a source and drain region (source and drain terminal or contact) and a gate region (gate terminal or contact) on the channel region.

A semiconductor device according to embodiments of the disclosed technology can include at least one semiconductor transistor. A MOSFET semiconductor device can include at least one metal-oxide-semiconductor (MOS) field effect transistor (FET). A complementary metal-oxide-semiconductor (CMOS) device can include at least a PMOS (p-channel) transistor and at least an NMOS (n-channel) transistor. A ferro-electric transistor (FeFET) memory device can include at least one ferro-electric field effect transistor.

Some state-of-the-art ferroelectric (FeFET) memory devices may resemble a metal-oxide-semiconductor (MOSFET) device. However, the gate oxide dielectric is replaced by a ferroelectric material in a FeFET device. By modulating the gate electrode (on top of the ferroelectric layer) accumulation or depletion at the ferroelectric-semiconductor (e.g., channel) interface will occur and thereby switch the FeFET on or off.

According to a first aspect, a semiconductor device is disclosed which includes a semiconductor substrate having a source/drain region and a channel region. The semiconductor device further includes a dielectric structure in between the channel region and a gate structure. The dielectric structure is thus present on top of the semiconductor substrate (on the channel region) and on the gate structure (which may also be referred to as a gate electrode structure or stack). The dielectric structure includes a high-k dielectric layer or a high-k ferroelectric layer (depending on the kind of semiconductor device) and at least one two-dimensional (2D) hexagonal boron-nitride (h-BN) layer in physical or direct contact with the high-k dielectric layer or the high-k ferroelectric layer. The at least one h-BN layer may be present on or below and in direct contact with the high-k dielectric layer or high-k ferroelectric layer. In some embodiments, the device may include another two dimensional h-BN layer in physical or direct contact with the high-k dielectric layer or high-k ferroelectric layer but at the opposite side than the side where the at least one two dimensional h-BN layer is contacting the high-k dielectric layer or high-k ferroelectric layer. The dielectric structure may thus include one 2D h-BN layer at one of the two sides of the high-k dielectric layer or high-k ferroelectric layer or two 2D h-BN layers at opposite sides of the high-k dielectric layer or high-k ferroelectric layer.

The gate structure may include any suitable gate electrode layer for semiconductor devices such as a metal gate electrode layer (for example TiN, TaN, W, TiC, Ru, etc.) or a poly-silicon gate electrode layer.

All the layers of the gate structure and the dielectric structure may be provided using deposition techniques such as chemical vapor deposition (CVD)-based or atomic layer deposition (ALD)-based techniques. For the formation of the two dimensional h-BN layer other deposition techniques are possible.

With the introduction of graphene, other two-dimensional materials such as hexagonal boron-nitride (h-BN) were discovered. h-BN has a hexagonal structure and a layered structure with similar lattice constant as graphene. Due to its similarities with graphene and it's white color it is often referred to as the 'white graphene'. h-BN is a two-dimensional insulator and known to be the second strongest material after graphene. It has a direct bandgap of about 5.9 eV. At elevated temperatures (up to 2000 degrees Celsius) h-BN remains stable. Moreover hBN has process stability (for example high resilience) and is non-toxic and environmentally friendly. The separation between boron and nitrogen in h-BN is smaller than the size of oxygen and gate-metal atoms. Therefore, an atomic layer of thin h-BN may insulate from oxygen diffusion and metal diffusion making h-BN a good barrier layer material.

By introducing a two dimensional h-BN layer into the dielectric structure of the semiconductor device, oxygen diffusion into the underlying channel (comprising for example silicon or germanium) and/or metal diffusion into the high-k dielectric layer or high-k ferroelectric layer may be prevented. Advantageously, endurance and lifetime of the transistor may be enhanced, in such device as memory transistors such as FeFETs. Endurance enhancement may be up to three orders of magnitude.

Advantageously, introducing the h-BN layer below the high-k dielectric layer or high-k ferroelectric layer may prevent diffusion of oxygen from the high-k dielectric layer or from the high-k ferroelectric layer towards the underlying semiconductor substrate (for example, a Si or Ge substrate). Thus the h-BN layer forms a barrier layer or interfacial layer in between the high-k dielectric layer or high-k ferroelectric layer and the semiconductor substrate.

Also, advantageously, introducing the h-BN layer above the high-k dielectric layer or high-k ferroelectric layer prevents diffusion of metal atoms from the gate structure (for example, a metal gate electrode) into the underlying high-k dielectric layer or high-k ferroelectric layer. Thus the h-BN layer forms a barrier layer or interfacial layer in between the high-k dielectric layer or high-k ferroelectric layer and the metal gate electrode layer.

In some embodiments, the h-BN layer has a thickness of less than five atomic layers. In some embodiments, the h-BN has a thickness of one to two atomic layers. Advantageously, a thinner barrier layer or interfacial layer maintains a relatively low EOT of the gate dielectric layer and thus a thinner h-BN layer can be advantageous. A thinner h-BN layer can increase gate stack thickness by a relatively small amount and correspondingly increase the EOT by a relatively small amount while maintaining a relatively low gate leakage.

In some embodiments, the h-BN layer may be provided using epitaxial growth of h-BN. Chemical-vapor-deposition (CVD) may be used to epitaxially grow the h-BN layer. Epitaxial growing the h-BN layer has been discovered to control the number of atomic h-BN layers. Another possible technique for providing the h-BN layer is by mechanical or chemical exfoliation (and transfer to the semiconductor substrate). Exfoliation has been discovered to provide a low thermal budget method of providing the h-BN layer.

Figure 1:
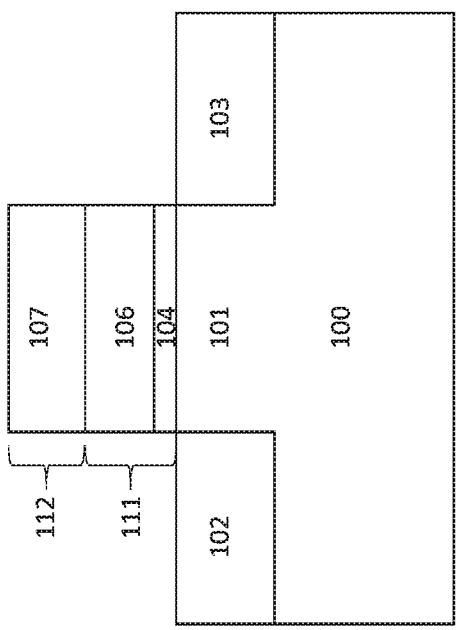
Figure 3:
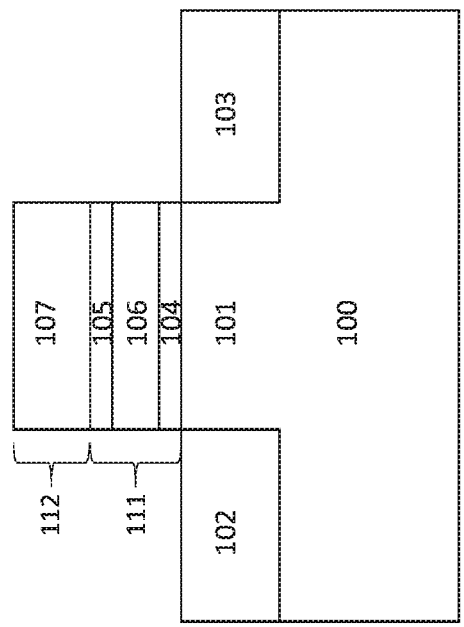

FIGS. 1 to 3 show a semiconductor device according to embodiments of the disclosed technology.

One kind of semiconductor device may be a metal-oxide-semiconductor field effect transistor (MOSFET) device according to some embodiments of the disclosed technology. The MOSFET device includes a semiconductor substrate 100 including two regions, a source region 102 and a drain region 103, defined at opposite sides of a third (middle) region, the channel region 101. On the channel region 101 a gate stack (111 and 112 together) is formed including a dielectric structure (e.g. gate dielectric stack) 111 and a gate structure (e.g. gate electrode stack) 112 on top of the gate dielectric stack 111. The gate dielectric stack 111, for a MOSFET device, includes a high-k dielectric layer 106 and at least one 2D h-BN layer 104, 105 in physical contact with the high-k dielectric layer 106. The h-BN layer 104, 105 can be introduced at different positions in the gate dielectric stack, i.e. below the high-k layer (h-BN 104), as in FIG. 1, or above the high-k layer (h-BN 105), as in FIG. 2. The h-BN layer can also be present at both positions i.e. below and above the high-k dielectric layer 106 as shown in FIG. 3.

The high-k dielectric layer can be made from any suitable high-k dielectric material, such as a Hf-based dielectric layer (e.g. $HfO_2$) and can be provided with thin film deposition techniques such as atomic layer deposition (ALD).

The gate structure 112 may include different gate electrode layers. The gate electrode stack may include a metal gate electrode layer such as a TiN, Ti, or WN layer. The gate electrode stack may include a workfunction metal layer, to tune the workfunction of the gate stack. The workfunction metal layer may be formed by one metal layer or by a stack of metal layers of one or more metal materials. The workfunction metal layer may, for example, be formed by a p-type workfunction metal such as TiN, TaN, or TiTaN, or by a stack of layers of such materials. The workfunction metal layer may, for example, also be formed by a n-type workfunction metal such as Al, TiAl, TiC, or TiAlC, or by a stack of layers of such materials. The gate electrode layers may be deposited by any conventional deposition process, for instance by ALD, CVD or physical vapor deposition (PVD). The gate electrode stack may include a gate filling layer such as a W layer. The gate electrode stack may also include a polysilicon based gate electrode layer.

Another kind of semiconductor device may be a ferroelectric field effect transistor (FeFET) memory device according to embodiments of the present disclosure. A FeFET memory device is a memory device which makes use of a ferroelectric layer, such as a high-k ferroelectric layer for storing data.

On a surface of the substrate 100, a source region 102 and a drain region 103 are provided. The source region 102 and drain region 103 are separated by a channel region 101. Above the channel region 101 a dielectric structure 111 is provided. The dielectric structure 111 includes a ferroelectric memory region including a ferroelectric layer 106. The ferroelectric layer 106 can include a high-k ferroelectric material such as a Hf-based ferroelectric material or Zr-based ferroelectric material. The ferroelectric layer 106 is provided on top of the channel region 101 of the semiconductor substrate. This may be in direct electrical contact with the channel region. Using a ferroelectric layer 106 as a gate dielectric layer (similar to the high-k dielectric layer for the MOSFET device) suppresses depolarization fields and offers high retention. The ferroelectric layer 106 may be provided with deposition techniques such as CVD-based or ALD-based deposition techniques.

On top and/or below the ferroelectric layer 106 at least one two dimensional h-BN layer 104, 105 is present in physical contact with the ferroelectric layer 106. Similar to embodiments of the MOSFET structure, the h-BN layer 104, 105 can be introduced at different positions in the dielectric stack, e.g. below the high-k based ferroelectric layer 106 as depicted as h-BN 104, or above the high-k based ferroelectric layer 106 as depicted as h-BN 105. The h-BN layer 104, 105 can also be present at both positions i.e. below and above high-k based ferroelectric layer 106.

On the dielectric structure 111 a gate structure 112 is provided similar to the gate structure 112 of the MOSFET device. The gate structure 112 may include different gate electrode layers. The gate electrode stack may include a metal gate electrode layer such as for example a TiN, Ti or WN layer.

According to embodiments of the present invention a method is disclosed for manufacturing a semiconductor device.

Figure 5:
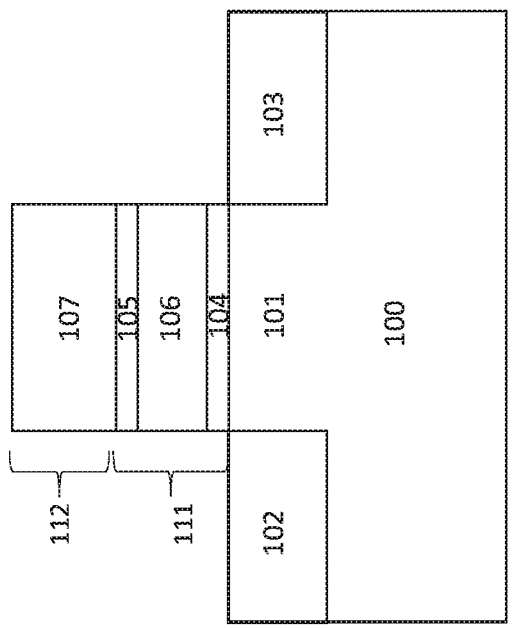
FIGS. 4 to 5 schematically illustrate process steps of manufacturing a semiconductor device according to embodiments of a second aspect.
Figure 4:
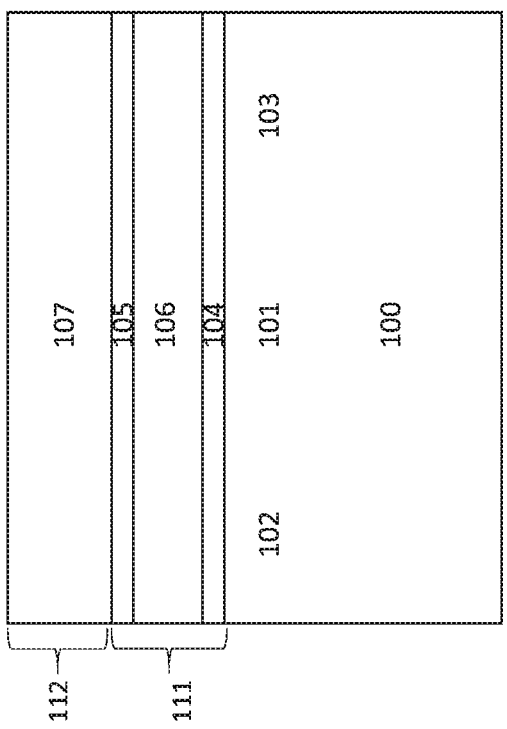

FIG. 4-5 show the semiconductor device after performing different steps of the method for manufacturing the semiconductor device. A stack of layers may be provided including a substrate 100, a dielectric structure 111 on the substrate 100 including a high-k dielectric layer or a high-k ferroelectric layer 106 and at least one two dimensional (2D) h-BN layer 104, 105 in physical contact with the high-k dielectric layer or the high-k ferroelectric layer 106, and a gate structure 112 on the dielectric structure. As shown in FIG. 4, the layers may be provided using deposition techniques such as techniques mentioned above, e.g. ALD, CVD, PVD. After providing the different layers, lithographic patterning and etching may be performed to provide the patterned structure illustrated in FIG. 5. Thereafter further annealing steps or implantation steps may be provided to form the source region 102 and the drain region 103.

In the previous examples gate-first semiconductor devices were disclosed. However replacement-metal-gate (RMG) devices (or also referred to as gate-last devices) can also be implemented. In a RMG process flow, poly-silicon and $SiO_2$ are first used as a dummy gate stack. After dopant activation (which includes high temperatures), the dummy gate stack is removed and replaced by the final gate stack (including a high-k dielectric and a metal gate). The RMG process flow avoids crystallization of the high-k dielectric layer during the high temperature process steps as well as chemical reaction between the metal gate and the high-k dielectric layer (metal diffusion). RMG schemes are thus advantageous in avoiding the early aggressive thermal budget for high-k dielectric and metal gate stacks.

In some embodiments, different RMG process schemes are possible such as depositing the gate dielectric stack formed by the h-BN layer and the high-k dielectric layer at the beginning of the process and protecting the gate dielectric stack by an etch stop layer during the removal of the dummy gate or depositing the h-BN layer and the high-k dielectric layer at the end of the process, e.g. after removing the dummy gate and before depositing the final metal gate.

It is an advantage according to embodiments that electrical characteristics of the RMG semiconductor device are improved.

What is claimed is:

1. A semiconductor device comprising:
    a semiconductor substrate comprising a channel region in between a source region and a drain region;
    a gate structure arranged on the semiconductor substrate that controls the channel region; and
    a dielectric structure arranged between the channel region and the gate structure, the dielectric structure comprising a dielectric layer comprising a high-k dielectric layer or a high-k ferroelectric layer and at least one two dimensional (2D) hexagonal boron-nitride (h-BN) layer in direct contact with the dielectric layer, wherein the at least one 2D h-BN layer comprises a 2D h-BN layer located between the dielectric layer and the gate structure.

2. The semiconductor device of claim 1, wherein the at least one 2D h-BN layer comprises a first 2D h-BN layer on a first side of the dielectric layer and a second 2D h-BN layer in direct contact with the dielectric layer on a second side opposite to the first side.

3. The semiconductor device of claim 2, wherein one or both of the first 2D h-BN layer and the second 2D h-BN layer has a thickness less than five atomic layers.

4. The semiconductor device of claim 1, wherein the high-k dielectric layer is a Hf-based dielectric layer or the high-k ferroelectric layer is a Hf-based ferroelectric layer.

5. The semiconductor device of claim 1, wherein the gate structure comprises a metal gate electrode.

6. The semiconductor device of claim 1, wherein the at least one 2D h-BN layer comprises a first 2D h-BN layer formed between the dielectric layer and the gate structure and a second 2D h-BN layer formed between the channel region and the dielectric layer.

7. A method of manufacturing a semiconductor device, the method comprising:
    providing a channel region in between a source region and a drain region in a semiconductor substrate;
    providing a dielectric structure on the channel region, providing the dielectric structure comprising:

providing a dielectric layer comprising a high-k dielectric layer or a high-k ferroelectric layer; and providing at least one two dimensional (2D) hexagonal boron-nitride (h-BN) layer in direct contact with the dielectric layer; and providing a gate structure on the dielectric structure such that a 2D h-BN layer is between the dielectric layer and the gate structure.

8. The method of claim 7, wherein providing the at least one 2D h-BN layer further comprises providing another 2D h-BN layer in direct contact with the dielectric layer at an opposite side of the dielectric layer on which the 2D h-BN layer is provided.

9. The method of claim 8, wherein providing the 2D h-BN layer or the another 2D h-BN layer comprises epitaxially growing, mechanically exfoliating, or chemically exfoliating.

10. The method of claim 8, wherein a thickness of one or both of the 2D h-BN layer and the another 2D h-BN layer is less than five atomic layers.

11. The method of claim 8, wherein the 2D h-BN layer is formed between the dielectric layer and the gate structure and the another 2D h-BN layer is formed between the channel region and the dielectric layer.

12. The method of claim 7, wherein the high-k dielectric layer comprises a Hf-based dielectric layer or the high-k ferroelectric layer comprises a Hf-based ferroelectric layer.

13. The method of claim 7, wherein providing the gate structure comprises providing a metal gate structure.

14. A semiconductor device comprising:
a semiconductor substrate comprising a channel region in between a source region and a drain region;
a gate structure arranged on the semiconductor substrate that controls the channel region; and
a dielectric structure arranged between the channel region and the gate structure, the dielectric structure comprising a dielectric layer comprising a high-k dielectric layer or a high-k ferroelectric layer, a first two dimensional (2D) hexagonal boron-nitride (h-BN) layer in direct contact with the dielectric layer on a first side of the dielectric layer, and a second 2D h-BN layer in direct contact with the dielectric layer on a second side opposite to the first side.

15. The semiconductor device of claim 14, wherein one or both of the first 2D h-BN layer and the second 2D h-BN layer has a thickness less than five atomic layers.

16. The semiconductor device of claim 14, wherein the high-k dielectric layer is a Hf-based dielectric layer or the high-k ferroelectric layer is a Hf-based ferroelectric layer.

17. The semiconductor device of claim 14, wherein the gate structure comprises a metal gate electrode.

18. A method of manufacturing a semiconductor device, the method comprising:
providing a channel region in between a source region and a drain region in a semiconductor substrate;
providing a dielectric structure on the channel region; and
providing a gate structure on the dielectric structure,
wherein providing the dielectric structure comprises:
providing a dielectric layer comprising a high-k dielectric layer or a high-k ferroelectric layer;
providing a two dimensional (2D) hexagonal boron-nitride (h-BN) layer between the dielectric layer and the gate structure; and
providing another 2D h-BN layer between the channel region and the dielectric layer.

19. The method of claim 18, wherein providing the 2D h-BN layer or the another 2D h-BN layer comprises epitaxially growing, mechanically exfoliating, or chemically exfoliating.

20. The method of claim 18, wherein a thickness of one or both of the 2D h-BN layer and the another 2D h-BN layer is less than five atomic layers.

21. The method of claim 18, wherein the high-k dielectric layer comprises a Hf-based dielectric layer or the high-k ferroelectric layer comprises a Hf-based ferroelectric layer.

22. The method of claim 18, wherein providing the gate structure comprises providing a metal gate structure.

23. The method of claim 18, wherein the 2D h-BN layer is formed in direct contact on a first side of the dielectric layer and the another 2D h-BN layer is formed in direct contact with the dielectric layer on a second side opposite to the first side.

* * * * *